US012676282B2

(12) United States Patent
Moore et al.

(10) Patent No.: US 12,676,282 B2
(45) Date of Patent: Jul. 7, 2026

(54) OPTICAL PROBE SYSTEM FOR THE ELECTRON MICROSCOPE

(71) Applicant: Waviks, Inc., Dallas, TX (US)

(72) Inventors: Thomas M. Moore, Dallas, TX (US); Benjamin Wolf, Dallas, TX (US); Gonzalo Amador, Dallas, TX (US)

(73) Assignee: Waviks, Inc., Dallas, TX (US)

( * ) Notice: Subject to any disclaimer, the term of this patent is extended or adjusted under 35 U.S.C. 154(b) by 0 days.

(21) Appl. No.: 19/005,582

(22) Filed: Dec. 30, 2024

(65) Prior Publication Data

US 2025/0379025 A1 Dec. 11, 2025

Related U.S. Application Data

(60) Provisional application No. 63/656,883, filed on Jun. 6, 2024.

(51) Int. Cl.
H01J 37/22 (2006.01)
H01J 37/26 (2006.01)

(52) U.S. Cl.
CPC ............ H01J 37/22 (2013.01); H01J 37/226 (2013.01); H01J 37/261 (2013.01); *H01J 2237/2602* (2013.01)

(58) Field of Classification Search
None
See application file for complete search history.

(56) References Cited

U.S. PATENT DOCUMENTS

| | | | | |
|---|---|---|---|---|
| 4,440,475 A | * | 4/1984 | Colliaux | H01J 37/228 |
| | | | | 359/372 |
| 2008/0283777 A1 | * | 11/2008 | Herschbein | H01J 37/304 |
| | | | | 250/492.2 |
| 2018/0166247 A1 | * | 6/2018 | Moore | H01J 37/02 |
| 2018/0270453 A1 | * | 9/2018 | Kupferschmid | G02B 23/2484 |
| 2019/0013178 A1 | * | 1/2019 | Zachreson | G02B 26/10 |
| 2019/0265459 A1 | * | 8/2019 | Hirata | A61B 1/0669 |
| 2021/0055534 A1 | * | 2/2021 | Zandbergen | H01J 37/20 |

* cited by examiner

*Primary Examiner* — James Choi
(74) *Attorney, Agent, or Firm* — Stephen Y. Liu; Carstens, Allen & Gourley, LLP

(57) ABSTRACT

An optical probe system and a microscope system. The optical probe system includes an optical probe with an optical probe shaft configured to extend at least partially into a vacuum chamber of a charged particle beam microscope. A first and second optical channel can extend through the optical probe shaft. The first optical channel accommodates a portion of a segmented optical axis, and the second optical channel accommodates an unsegmented optical axis. The segmented optical axis includes at least a first segment that substantially parallel to the unsegmented optical axis and at least a second segment that is not substantially parallel to the unsegmented optical axis, and the first segment of the segmented optical axis and the unsegmented optical axis are positioned within the optical probe shaft to permit the first optical channel and the second optical channel to simultaneously address a sample within the vacuum chamber.

25 Claims, 11 Drawing Sheets

OPTICAL PROBE SYSTEM FOR THE ELECTRON MICROSCOPE

RELATED APPLICATIONS

The present disclosure claims priority to U.S. Provisional Patent Application Ser. No. 63/656,883, filed Jun. 6, 2024, which is incorporated herein by reference in its entirety for all purposes.

BACKGROUND

Technical Field

Novel aspects of the present disclosure relate to the field of microscopy and more particularly to an optical probe system usable with a charged particle beam microscope which facilitates rapid alignment of an optical probe during installation and use.

Background

Charged particle beam microscopes (CPBMs) are widely used in advanced materials research and failure analysis to perform investigations on sub-millimeter sized (e.g., microscale or nanoscale) samples or regions on a sample. The term "charged particle beam microscope" includes, but is not limited to, the scanning electron microscope (SEM), the transmission electron microscope (TEM), the (scanning) transmission electron microscope ((S)TEM), the focused ion beam microscope (FIB) (sometimes in combination with an SEM, the FIB-SEM), the plasma FIB (PFIB) and the helium ion microscope (HIM). These microscopes have a vacuum chamber in which a charged particle beam is produced, directed, and focused to be incident on a sample to be studied. A sample holder and sample stage mounted within the vacuum chamber permit exchange of samples and positioning within the microscope to bring the charged particle beam to impinge on a region of interest.

Some lower-magnification instruments such as the SEM can be operated at a lower vacuum (a "standard" vacuum level is typically $10^{-7}$ Torr in the sample chamber) or even closer to atmospheric pressure with water-vapor containing environments. Higher-magnification CPBMs require higher vacuum, with atomic-resolution instruments such as TEMs typically operating at Ultra-High Vacuum (UHV) levels (defined to be $10^{-10}$ Torr or better) and requiring periodic bake-out procedures (typically >200° C. for 24 hours) to drive off water vapor and other contaminants from the chamber walls and interior components.

In addition to producing images of microscopic details, a variety of analytical and characterization functions can be performed within the microscope, using the charged particle beam alone with built-in detectors, or in combination with other types of excitation sources and/or sensors. Some of these types of analytical functions, as well as deposition and etching capabilities, may be implemented using vacuum-compatible accessory instruments that may be connected to a port on the microscope that provides access to the sample in the vacuum chamber. In many cases, in order to perform their function, such instruments need to be brought into close proximity to a region of interest on the sample, and often must be pointed directly at it. Multiple accessories are frequently left installed, either for simultaneous use, or to save time by obviating the need for reinstallation, alignment, and calibration, so that the vacuum chamber near a sample can become crowded with several instruments pointed at the sample. The space outside the vacuum chamber can also become crowded on a versatile analytical microscope with large analytical instruments supported on neighboring vacuum ports.

SUMMARY OF THE INVENTION

Novel aspects of the present disclosure are directed to an optical probe system that includes an optical probe with an optical probe shaft configured to extend at least partially into a vacuum chamber of a charged particle beam microscope. A first optical channel and second optical channel extend through the optical probe shaft. The first optical channel accommodates a portion of a segmented optical axis, and the second optical channel accommodates an unsegmented optical axis. The segmented optical axis includes at least a first segment that substantially parallel to the unsegmented optical axis and at least a second segment that is not substantially parallel to the unsegmented optical axis, and the first segment of the segmented optical axis and the unsegmented optical axis are positioned within the optical probe shaft to permit the first optical channel and the second optical channel to simultaneously address a sample mounted within the vacuum chamber.

Novel aspects of the present disclosure are also directed to a microscope system that includes a charged particle beam microscope and an optical probe system coupled with the charged particle beam microscope. The optical probe system includes an optical probe with an optical probe shaft configured to extend at least partially into a vacuum chamber of the charged particle beam microscope. A first optical channel and second optical channel extend through the optical probe shaft. The first optical channel accommodates a portion of a segmented optical axis, and the second optical channel accommodates an unsegmented optical axis. The segmented optical axis includes at least a first segment that substantially parallel to the unsegmented optical axis and at least a second segment that is not substantially parallel to the unsegmented optical axis, and the first segment of the segmented optical axis and the unsegmented optical axis are positioned within the optical probe shaft to permit the first optical channel and the second optical channel to simultaneously address a sample mounted within the vacuum chamber.

Other aspects, embodiments and features of the invention will become apparent from the following detailed description of the invention when considered in conjunction with the accompanying figures. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention.

BRIEF DESCRIPTION OF THE FIGURES

The novel features believed to be characteristic of the disclosure are set forth in the appended claims. The novel aspects of this disclosure, however, as well as a preferred mode of use, further objectives and advantages thereof, will be best understood by reference to the following detailed description of illustrative embodiments when read in conjunction with the accompanying figures, wherein:

DETAILED DESCRIPTION

Figure 1:
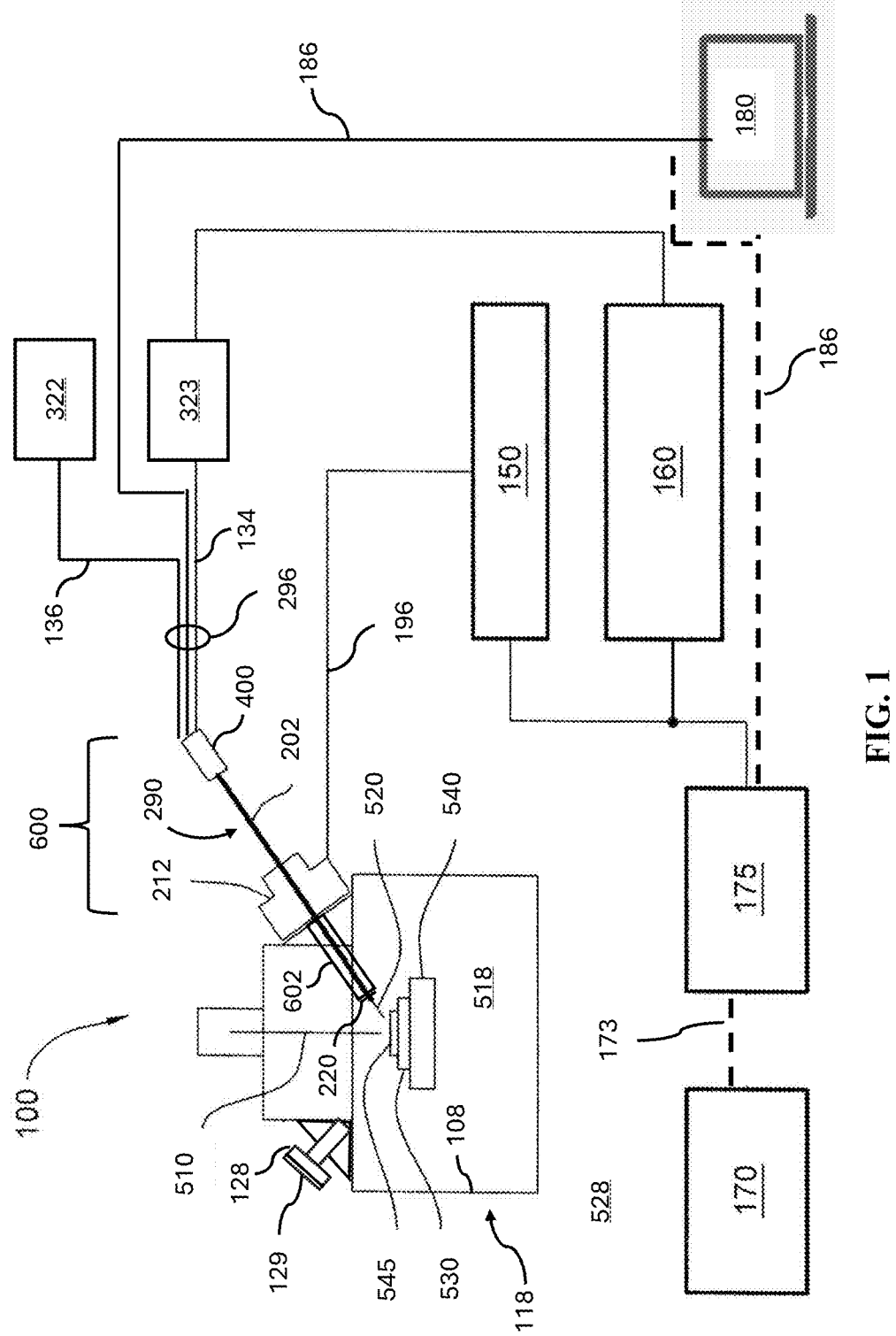
FIG. 1 is a schematic diagram of a charged particle beam microscope in accordance with an illustrative embodiment.

"In situ" techniques allow investigation of microscopic areas or nanostructures of a sample at high resolution within a charged particle beam microscope (CPBM) with simultaneous application of external stimuli such as heat and light. In particular, bringing one or more optical channels into the vacuum chamber can enable simultaneous observation of nanostructures and illumination using the charged particle beam and various wavelengths of light delivered to the sample. The combination of simultaneous charged particle beam and optical beam stimulation and detection offers a broad range of additional analytical and sample characterization capabilities. Some of these additional capabilities include, but are not limited to, optical microscopic imaging, non-contact localized heating, ion or electron beam-induced (cathodo-)luminescence (spectral and/or imaging), Raman spectroscopy, photoluminescence, and induced electron energy loss and gain (SEELS, sEEGS) spectroscopy and imaging. Illumination with tightly-focused laser spots delivered to the sample makes charged particle beam observation possible of localized areas affected by the laser, such as laser heating of the sample at the microscale and facilitates studies of micro-and-nanoscale optical and optoelectronic properties, photoluminescence, photocatalysis, photodeposition, and photoconductivity. Some optical properties of nanostructures can be deduced using techniques that use only the charged particle beam, such as Electron Energy Loss Spectroscopy (EELS) in a TEM, but while these techniques have excellent spatial resolution, they have relatively low energy resolution (on the order of $10^{-1}$ eV) compared to photo-induced absorption and emission spectroscopies ($<10^{-3}$ eV).

Careful alignment and focusing of light delivery (e.g., laser focusing) and light gathering optics is essential to maximize the efficiency of these techniques. Physical alignment of an optical probe system to the point on the sample on which the charged particle beam impinges has often been challenging and time-consuming, particularly in TEMs and similar CPBMs, which have an extremely confined space near the sample and few choices of port angles from which to approach and/or observe. Alignment is required during installation, as well as to optimize position for illumination or observation of different regions of interest on a sample. The difficulty in establishing and maintaining proper alignment of an optical probe system has become a major expense in operation of a CPBM with these optical capabilities and a deterrent to routine use of an optical probe, restricting the amount and quality of relevant materials research that can be done, and the number of researchers willing to perform it. There is thus a need for a vacuum-compatible optical probe system for CPBMs that combines optical functions (to use fewer microscope ports) into a compact device that takes minimal space both inside and outside the vacuum chamber, and that enables rapid alignment during installation, as well as during operation and when samples are changed.

Novel aspects of this disclosure recognize the need for a system and method offering rapid alignment of a unique optical accessory for a CPBM that has a charged particle beam contained within a vacuum chamber, where the optical accessory simultaneously provides non-contact photothermal heating of the sample, and an array of sophisticated optical and charged particle spectroscopy capabilities. The combination of simultaneous charged particle beam and optical beam stimulation and detection offers a broad range of additional analytical and sample characterization capabilities that are not now available in a conventional CPBM.

FIG. 1 is a schematic diagram of a charged particle beam microscope in accordance with an illustrative embodiment. The charged particle beam microscope 100 can be, but is not limited to, a scanning electron microscope (SEM), a helium ion beam microscope (HIM), a focused ion beam microscope (FIB), a combined SEM/FIB, a transmission electron microscope (TEM), or a microscope formed from any combination thereof. The charged-particle beam microscope 100 includes an optical probe system 600, which can be integrated into or mounted in or on the charged particle beam microscope 100. Novel aspects of this disclosure facilitates the rapid alignment of the optical probe system 600 in the charged particle beam microscope 100.

The exemplary optical probe system 600 in FIG. 1 generally includes an optical probe 290 having an optics chassis 400 at one end and a window 220 at its opposite end. The optics chassis 400 contains equipment and optics needed to transmit light to and receive light from a sample 545, and to image, process, and/or analyze the sample 545. In some embodiments, the window 220 is a clear, vacuum sealed window that is strong enough to withstand a range of vacuum pressures typically maintained within a vacuum chamber 118 of the charged particle beam microscope 100. The optical probe system 600 can also include a nanomanipulator 212 that controls the positioning of the optical probe 290 during alignment and use. In other embodiments, the optical probe system 600 can be replaced by optical probe system 200 or optical probe system 700, shown and described in more detail in FIGS. 2 and 7, respectively.

Figure 6:
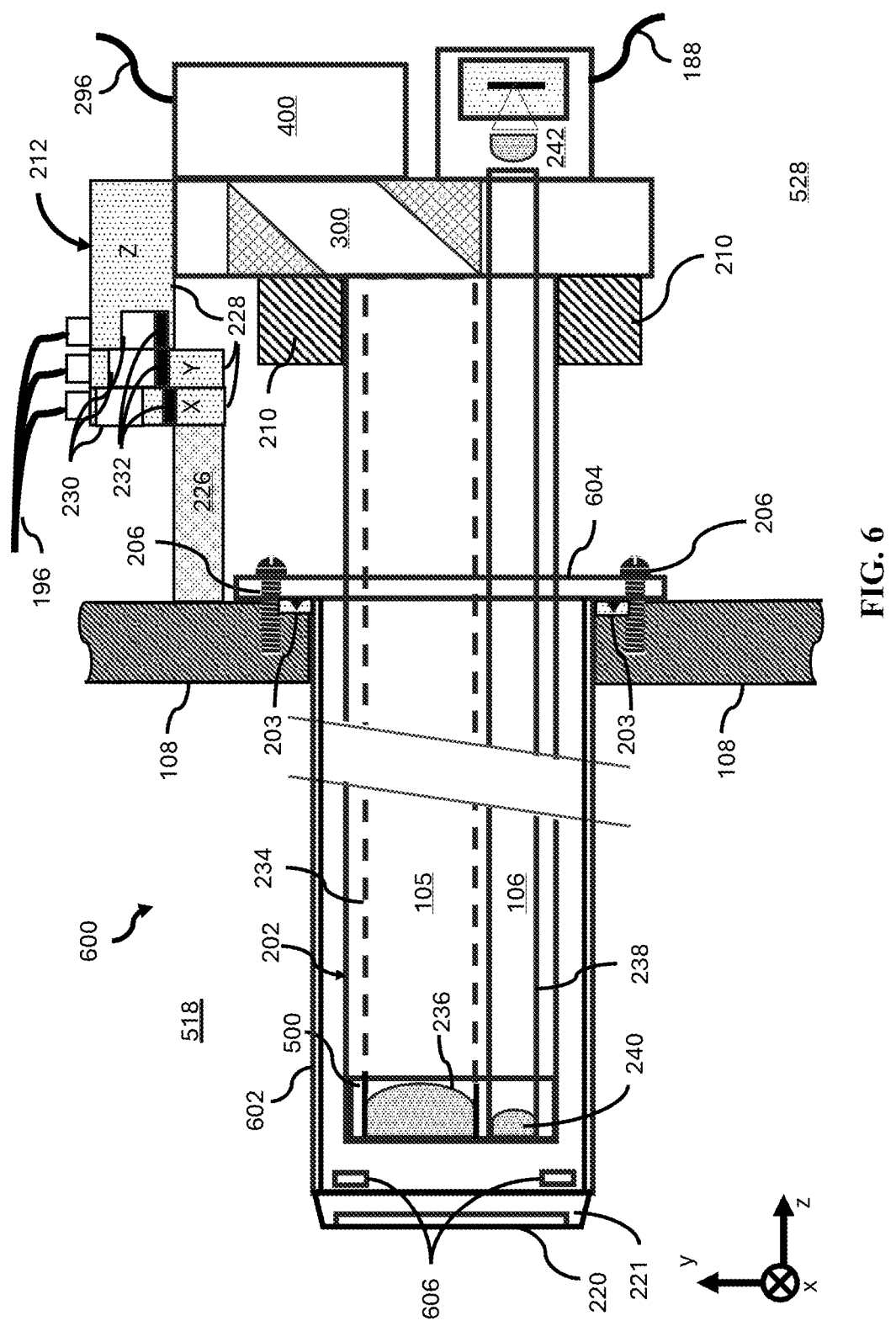
FIG. 6 is a schematic diagram of an optical probe system in accordance with another illustrative embodiment.

The optical probe system 600 houses two or more simultaneous imaging pathways, shown and described in more detail in FIG. 6 that follows, contained within an optical probe shaft 202 of the optical probe 290. Although the various embodiments of the optical probe system 600 depicts only two substantially parallel optical channels contained inside of an optical probe shaft 202 of the optical probe system 600, the example embodiments presented here are exemplary and non-limiting. These two substantially parallel optical channels are identified as the optical beam channel 105 and the borescope channel 106. An example of such an optical probe system that can be adapted for use as optical probe system 600 is the Vesta™ laser sample-heating system manufactured by Waviks, Inc. of Dallas, Texas, USA.

As shown schematically in FIG. 1, the vacuum chamber 118 of the charged-particle beam microscope 100 is formed from a microscope wall 108 that separates vacuum chamber interior 518, which is typically maintained at vacuum, from the exterior environment 528, which is typically maintained at atmospheric pressure. The microscope wall 108 can include additional features such as port flanges (not shown) to facilitate attachment and removal of accessories. For example, the microscope wall 108 can include a port 128 sealed by a port cover 129 to provide a viewing window into the vacuum chamber interior 518.

The optical probe shaft 202 passes through the microscope wall 108 of the vacuum chamber 118 and extends at least partially into the vacuum chamber interior 518. The optical probe shaft 202 carries the optical beam channel 105 and the borescope channel 106 into the vacuum chamber 518. In FIG. 1, the optical probe shaft 202 is isolated from the environment in the vacuum chamber 118 by an optional stationary outer tube 602. The stationary outer tube 602, which is shown and described in more detail in FIGS. 6 and 7, can be used with microscopes that operate at ultra-high vacuum ($10^{-10}$ Torr or better, which is typical for a TEM) and require periodic bake-out procedures (typically >200° C. for 24 hrs).

A sample 545 can be secured on a sample holder 530 that is in turn suspended in the vacuum chamber interior 518 by a microscope stage 540. Proper alignment of the charged optical probe system 600 permits the co-location of an optical beam 520 conveyed along the optical beam channel 105 and a charged particle beam 510 on the sample 545. Alignment can be achieved by way of a nanomanipulator 212 that permits the focus location of the optical probe 290 to be moved within the charged particle beam microscope 100 with reference to a wide field of view provided by the borescope channel 106. The charged particle beam microscope 100 includes a motion controller 150, which provides the control signals for controlling positioning of the nanomanipulator 212. The motion controller 150 is connected to the nanomanipulator 212 by a nanomanipulator umbilical 196 formed from one or more electrical conduits, such as wire cable, for carrying control signals. A suitable nanomanipulator that can be readily adapted to this purpose is the Oxford Instruments Omniprobe Model 200.

The optics chassis 400 can be communicatively coupled to equipment and accessories, examples of which are depicted in FIG. 1, by an optics umbilical 296 formed from conduits, such as optical fiber and wire cables for carrying optical signals and electrical signals, respectively. For example, the optics umbilical 296 can include a delivery fiber 134 that carries light to the sample 545 and a recovery fiber 136 that carries light from the sample 545. In a non-limiting embodiment, the delivery fiber 134 and the recovery fiber are formed from guided-wave optical fiber but can take the form of free-space optics in other embodiments. The optics umbilical 296 can also include a set of signal wires 186 for carrying a camera signal and/or a borescope camera signal. As used herein, the term "set" means one or more. Thus, a set of signal wires 186 can be one signal wire or two or more signal wires. In this disclosure, the set of signal wires 186 can carry the camera and/or the borescope camera signal to a display 180 for viewing by a user. The set of signal wires 186 can also optionally bring one or more signals to a master controller 175, which can provide a single user interface for controlling subsystems of the optical probe system 600.

The charged particle beam microscope 100 can also include a light source 323, which provides illumination for a borescope tube 238 that houses the borescope channel 106. The light source can be any form of light illumination, including laser and/or visible light. The light source 323 can be connected to the optics chassis 400 by a delivery fiber 134. The charged particle beam microscope 100 can also include a light analyzer 322, which can be used for analyzing recovered light. A non-limiting example of the light analyzer 322 can include a spectrometer. The light analyzer 322 can be connected to the optics chassis 400 by a recovery fiber 136.

The light source 323 can be controlled by optics controller 160, which contains components of the optical probe system 600, including illumination sources for imaging, lasers, spectrometers, and actuators for moveable mirrors in the optics chassis 400. The optics controller 160 is connected to the optics chassis 400 with electrical cables and fiber optic cables. The optics controller 160 and in some embodiments also the motion controller 150, can be controlled by master controller 175. In some embodiments, the master controller 175 can also interface with the microscope controller 170 via an optional microscope control interface 173 to permit the microscope controller 170 to automate operation of the optics controller 160.

Figure 2:
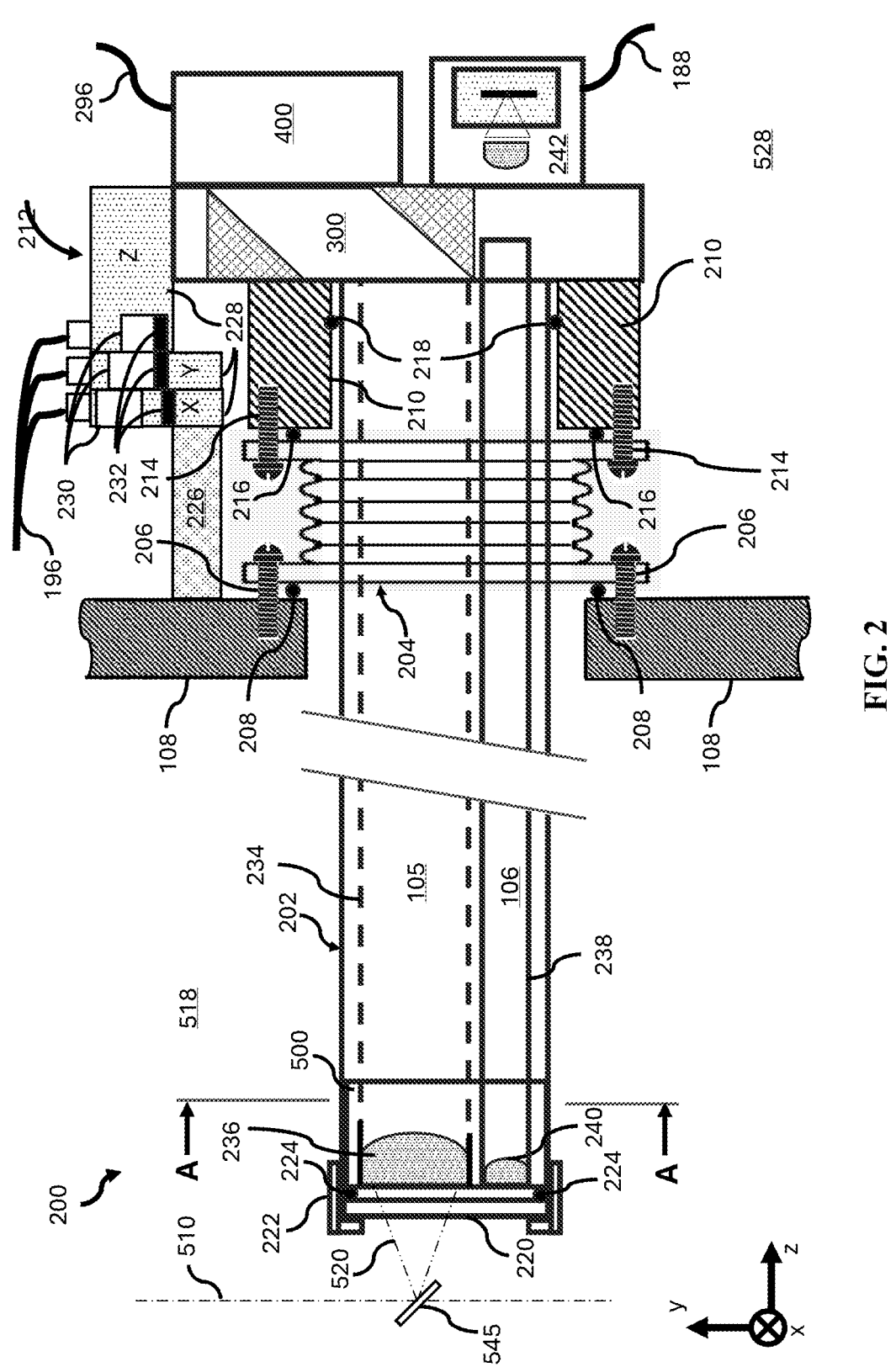
FIG. 2 is a schematic diagram of an optical probe system in accordance with an illustrative embodiment.

FIG. 2 is a schematic diagram of an optical probe system in accordance with an illustrative embodiment. At least some of the novel aspects of this disclosure facilitates rapid alignment of the charged particle beam 510 with an optical beam 520 carried along an optical beam channel 105 by referencing a wide field of view provided by the borescope channel 106. The relative position of the distal ends of the optical beam channel 105 and the borescope channel 106 maintains an overlapping field of view that provides for easy alignment with a focal point on the sample 545 excited by the charged particle beam 510.

The optical probe system 200 is suitable for microscopes that operate at a "standard" vacuum level (typically $10^{-7}$ Torr in the sample chamber which is typical for an SEM or FIB). In FIG. 2, the left side of the drawing represents the vacuum chamber interior 518 at vacuum conditions and the right side of the drawing represents the external environment 528, which is generally maintained at atmospheric pressure. The optical probe shaft 202 extends through an opening passing through the microscope wall 108 to allow at least a portion of the optical probe shaft 202 to be housed within the vacuum chamber interior 518 and exposed to vacuum. Vacuum conditions within the vacuum chamber 118 are preserved by vacuum bellows 204, which can be formed from a rigid material, such as stainless steel. The vacuum bellows 204 allows translation of the optical probe shaft 202 in three dimensions while under vacuum, e.g., along an X-Y plane relative to the surface of the sample 545 and in the Z-direction for controlling the focus distance to the sample 545.

The vacuum bellows 204 can be sealed against the microscope wall 108 by a plurality of wall bolts 206 that compresses a wall seal 208 between the microscope wall 108 and one of the flanged ends of the vacuum bellows 204. The vacuum bellows 204 can also be sealed against the optical probe shaft mount 210 of the nanomanipulator 212. In particular, a bellows bolt 214 compresses a bellows seal 216 between the probe shaft mount 210 and an adjacent, flanged end of the vacuum bellows 204. A probe shaft seal 218 can also be provided to form a vacuum seal between the optical probe shaft 202 and the optical probe shaft mount 210. The end of the optical probe shaft 202 can be sealed by a window 220 that is secured in place by an endcap 222. A window seal 224 can be used to provide a vacuum seal at the end of the optical probe shaft 202.

In some embodiments, the nanomanipulator 212 can be securely mounted to the microscope wall 108 via nanomanipulator mount 226. Nanomanipulator mount 226 can be adjustable, separate, or affixed to either the nanomanipulator 212 or the microscope wall 108. Movement of the optical probe shaft 202 in the three dimensions can be achieved by the motion stage 228 of the nanomanipulator 212. The motion stage 228 can be driven by actuator(s) 230, which can be motorized or manually operated. For example, the actuator(s) 230 can be one or more actuators and take the form of a motorized or hand-turned lead screw. Further, the actuator(s) 230 can be an electromechanical or piezoelectric device. Positions sensors 232 can be included for providing a readout and/or closed-loop position control. As previously mentioned, power and control signals can be provided to the nanomanipulator 212 via nanomanipulator umbilical 196.

The optical probe shaft 202 is depicted as a generally elongated, cylindrical tube that houses an optical beam channel 105 and a borescope channel 106, but in another embodiment more than two optical channels can be housed in the optical probe shaft 202. The optical beam channel 105 is a conventional free space optics pathway for high magnification imaging, laser spot formation, and light detection. This optical beam channel 105 provides a high magnification image of the sample surface at roughly 100× magnification and with a working distance of typically 12 mm to 25 mm, a field of view roughly 2 mm in width, and a narrow depth of field, similar to that of an optical microscope, which is useful for focusing the laser to a spot on the sample surface when the high magnification image is in focus.

This optical beam channel 105 can be enclosed within a dedicated tube, optical beam tube 234, which is substantially parallel to, and contained within, the optical probe shaft 202. Alternatively, the optical beam tube 234 for the optical beam channel 105 can be omitted without degrading the optical performance of the optical beam channel 105. In either event, an objective lens 236 can be disposed at a distal end of the optical probe shaft 202 to focus light onto a sample 545 and collect the returning light.

The central axis of the optical beam channel 105, while remaining parallel to the axis of the optical probe shaft 202, can be translated away from the central axis of the optical probe shaft 202 to allow space for the borescope channel 106. In an exemplary embodiment of this disclosure, the central axis of the optical beam channel 105 is translated away from the central axis of the optical probe shaft 202 by a periscope 300, as shown and described in more detail in FIG. 3 that follows.

The borescope channel 106 extends through a rigid borescope tube 238 (or rigid endoscope tube) and is used for low-magnification imaging of the sample 545. A non-limiting example of the type of borescope that can be adapted for use in the charged particle beam microscope 100 includes a gradient-index (GRIN) relay lens borescope such as a Hawkeye® Pro Slim Borescope, available from Gradient Lens Corporation, Rochester, NY, which provides a wide field of view for locating the laser spot and aligning the optical probe shaft 202 with the impact point of the charged particle beam 510 on the sample 545. In contrast to the high magnification view of the optical beam channel 105, the borescope channel 106 is typically focusable within 5 to 100 mm with a 50 mm wide field of view and roughly a 10× magnification. Such a GRIN lens borescope can also provide illumination for imaging in the sample chamber for both the borescope channel 106 and the optical beam channel 105 using a ring-like fiber optic illumination system surrounding the tip of the borescope tube 238. Alternatively, the illumination for imaging the sample 545 can be provided by one or more illumination fibers, or other illumination sources such as LEDs, positioned at or near the inner surface of the vacuum window 220. The GRIN relay lens borescope avoids the issue of overheating of electrical components that can occur in the narrow optical probe shaft 202, even at atmospheric pressure, which can occur when using a borescope that has a camera chip housed at the tip of the borescope tube 238.

A borescope objective 240 is provided at a distal end of the borescope tube 238. The objective 240 can be a separable lens that is removably attached to the borescope 106 or integrated with a relay path of the borescope 106, e.g., as in a gradient-index type borescope, to collect light and transmit an image back from the distal end of the borescope tube 238 to the proximal end of the borescope tube 238 for viewing, either by eye via an eyepiece or a camera image sensor of a borescope camera 242, which can capture an image for presentation on a display, such as display 180. As previously mentioned, the borescope camera signal can be carried from the borescope camera 242 by a set of signal wires 186.

Figure 5:
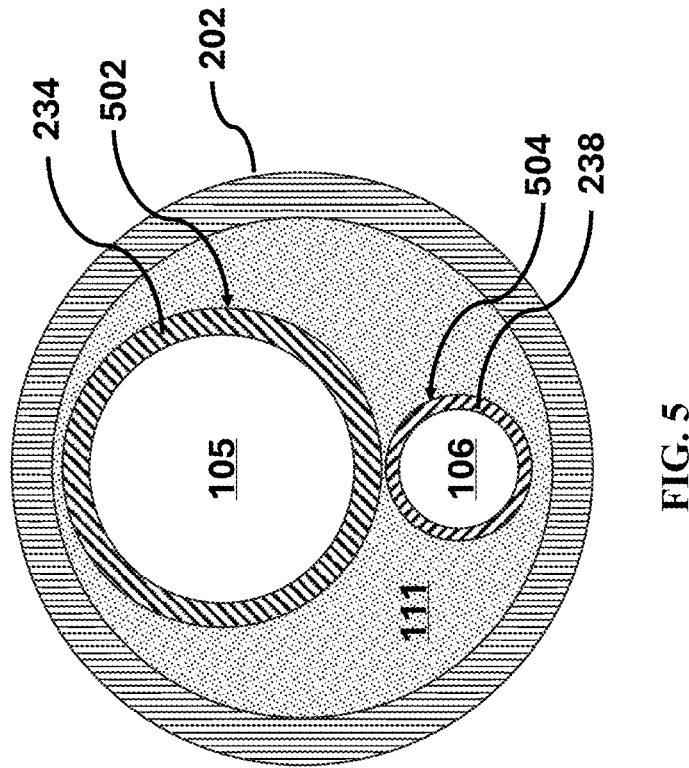
FIG. 5 is a schematic diagram depicting a plan view of a spacer in accordance with an illustrative embodiment.

To maintain the relative lateral separation of the optical beam channel 105 and the borescope channel 106, particularly, when the optical beam channel is housed within an optical beam tube 234 and the borescope channel 106 is housed within a rigid borescope tube 238, the optical probe system 200 can include a spacer 500 coupled to each of the optical beam tube 234 and the borescope tube 238. A cross-sectional view of the spacer 500 is shown in FIG. 5, taken along line A-A of FIG. 2, which depicts a first aperture 502 sized to receive the optical beam tube 234 and a second aperture 504 sized to receive the borescope tube 238. In some embodiments, the spacer 500 is fixedly attached to each of the optical beam tube 234 and the borescope tube 238. In another embodiment, as shown and described in more detail in FIG. 7, the spacer 500 is fixedly attached to the optical beam tube 234 and slidably engaged with the borescope tube 238 to allow the borescope tube 238 to translate in the axial direction.

The optics chassis 400 contains the optical components needed to perform the combined charged particle beam and optical beam experiments. For example, an optics chassis 400 suitable for cathodoluminescence contains a collimator for signal recovery, and a retractable beam splitter, camera lens, and camera for microscopic imaging of the surface of the sample 545. The camera and camera lens can be positioned for infinity focus through the optical beam channel 105, i.e., through the periscope 300 and through the optical probe shaft 202. The objective lens 102 at the distal end of the optical probe shaft 202 produces a magnified image of the surface of the sample 545 at the camera chip attached to the optics chassis 400. For Raman spectroscopy, for example, additional components may be added including, but not limited to, a wavelength-specific high-pass dichroic filter, a laser line cleanup filter, a high pass filter, and a second fiber collimator to produce a collimated laser beam from the laser source.

The periscope 300 of optical probe system 200 optically translates free-space optical beams traveling along the optical beam channel 105 to form a segmented optical axis that increases lateral separation of disjointed segments of the optical axis. The increased lateral separation makes room for the rigid borescope tube 106 in the optical probe shaft 202 and makes room for the corresponding optics mounted on the housing of the optical probe system 200. In the illustrative embodiment depicted in FIG. 2, the increased lateral separation between the optical beam channel 105 and the borescope channel 106 is at the proximal end of the optical probe system 200 so that optics associated with the optical beam channel 105 and the optics associated with the bore-scope channel 106 can all be accommodated at their respective terminal ends. For example, the optics chassis 400 at the terminal end of the optical beam channel 105 is shifted away from the borescope camera 242 at the terminal end of the borescope channel 106 so that both the optics chassis 400 and the borescope camera 242 can be accommodated at the proximal end of the optical probe 290. A typical vertical displacement of the optical probe pathway 105 is 45 mm.

Figure 3:
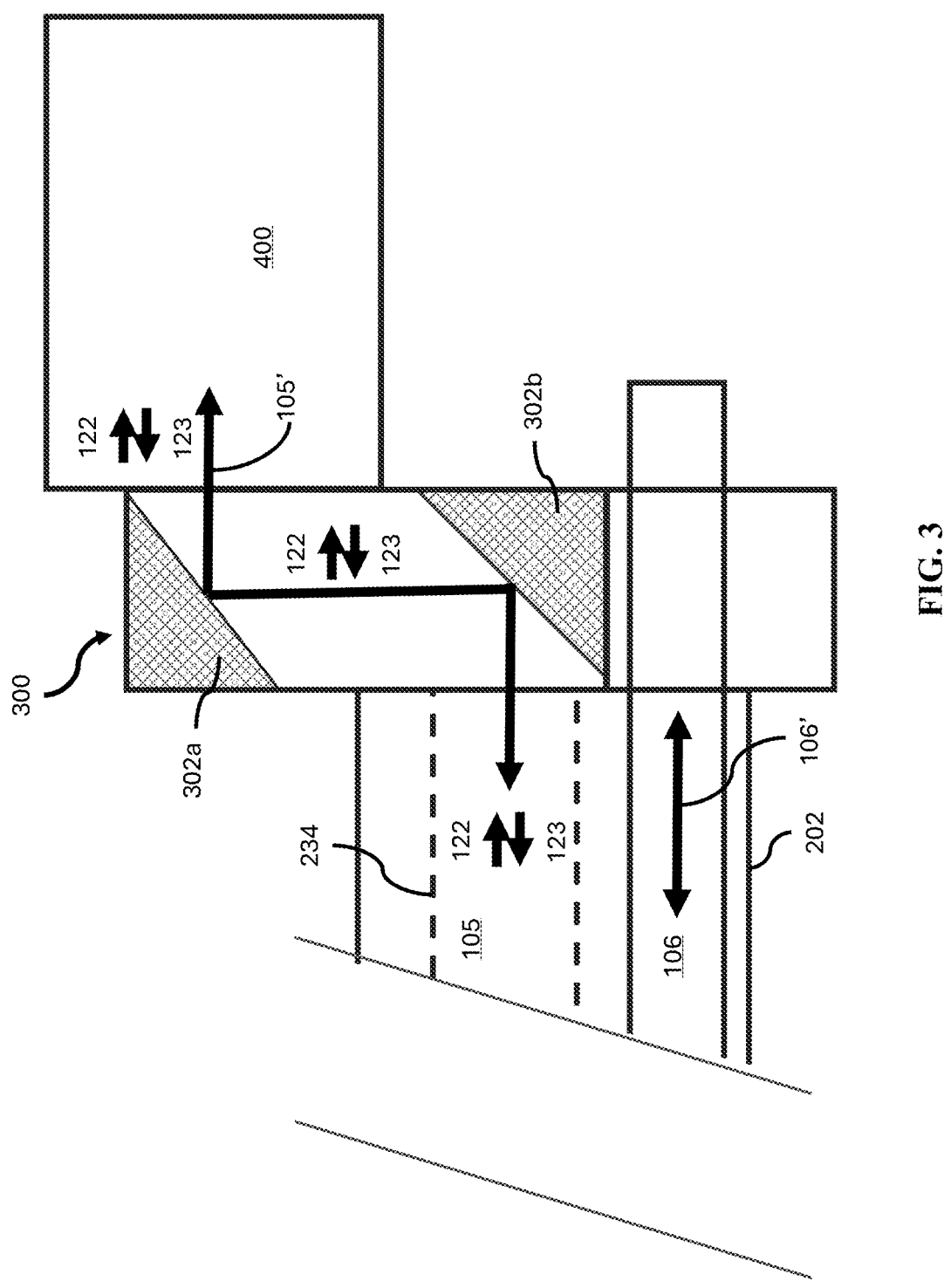
FIG. 3 is a schematic diagram of a periscope in accordance with an illustrative embodiment.

FIG. 3 is a schematic diagram of a periscope in accordance with an illustrative embodiment. The periscope 300 includes a set of turning mirrors 302a and 302b (collectively, turning mirrors 302) for translating light conveyed along the optical beam channel 105. In the depicted embodiment, the set of turning mirrors 302 includes two right angle mirrors. In another embodiment, the set of turning mirrors 302 can be replaced by prisms.

The segmented optical axis that passes through the optical beam channel 105 is represented by the double-headed arrow 105' that has a first segment that passes through the optical beam channel 105, a second segment that passes through the periscope 130, and a third segment that extends into the optics chassis 400. Displacement of the segmented optical axis by the periscope 300 allows for greater separation of optics equipment and accessories, as previously described. The unsegmented optical axis passes through the borescope channel 106 and is represented by the double-headed arrow 106'. The first and third segments of the segmented optical axis 105' and are both substantially parallel to the unsegmented optical axis 106', but in another embodiment, the third segment of the segmented optical axis 105' can be angled relative to unsegmented optical axis 106'.

Arrow 122 shows the direction of recovered light returning from the sample 545 to the optics chassis 400 along the segmented optical axis 105'. Arrow 123 shows the direction of delivered light traveling from the optics chassis 400 to the sample 545 along the segmented optical axis 105'. The delivered light can be used for irradiation, heating, excitation, or illumination.

Figure 4:
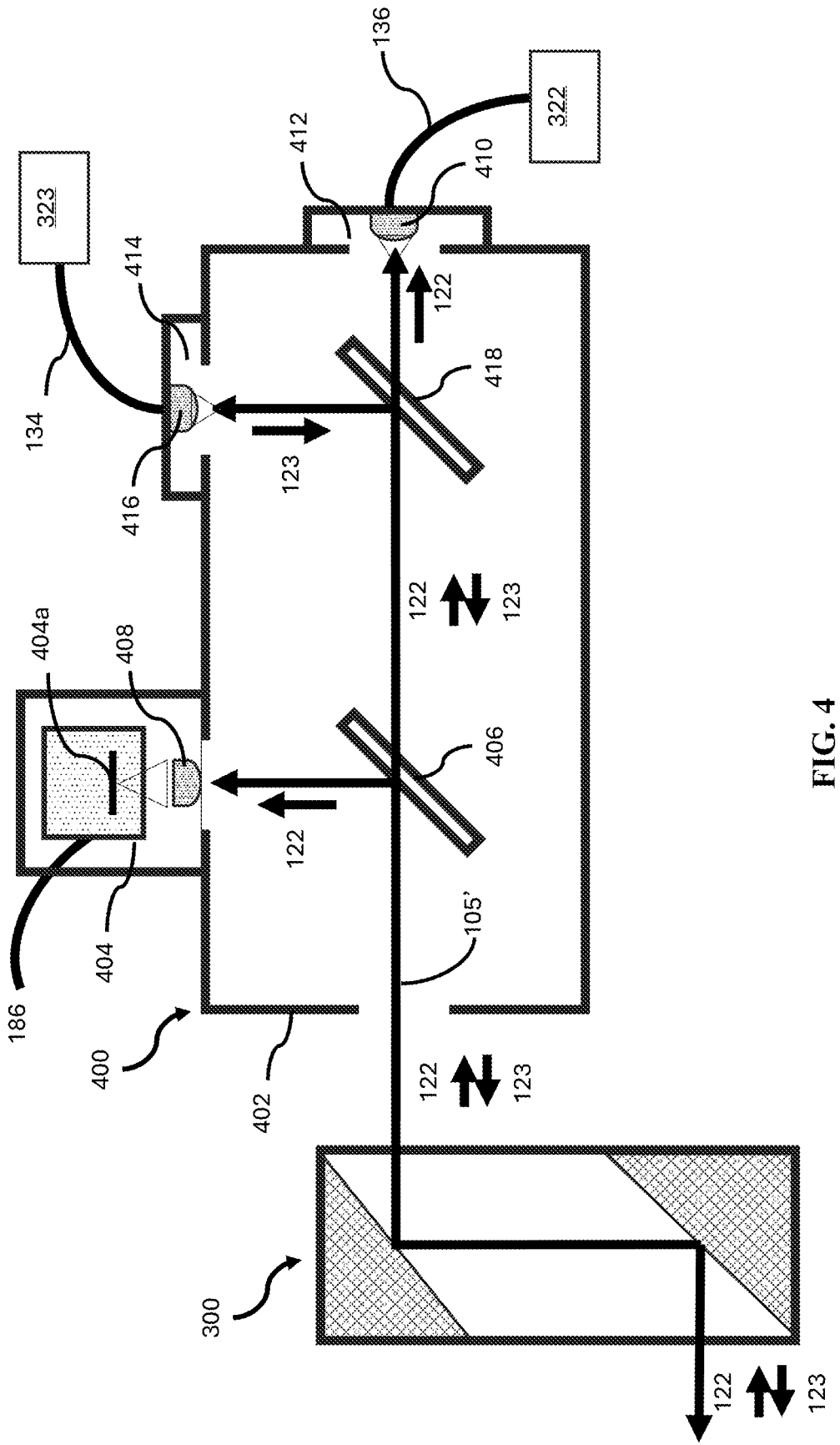
FIG. 4 is a schematic diagram of an optics chassis in accordance with an illustrative embodiment.

FIG. 4 is a schematic diagram of an optics chassis in accordance with an illustrative embodiment. The optics chassis 400 is formed generally from an enclosure 402 that supports optical elements and excludes ambient light. The optics chassis 400 houses at least a portion of the segmented optical axis 105', e.g. the third segment of segmented optical axis 105'. A first branch of the segmented optical axis 105' has an endpoint that terminates at imaging camera 404. In particular, recovered light 122 conveyed from the sample 545 to the optics chassis 400 encounters imaging mirror 406 that redirects the recovered light 122 through a camera eyepiece lens 408 and to an image sensor 404a of the imaging camera 404. The image sensor 404a can be a charge-couple device (CCD) sensor or a complementary metal-oxide semiconductor (CMOS) sensor. The imaging mirror 406 can be a beamsplitter or a moveable mirror coupled with one or more actuators that can cause the imaging mirror 406 to move into and out of the optical beam channel 105. The imaging camera 404 can include a camera signal wire 186, which carries camera signals to and from the imaging camera 404.

In some embodiments, all or part of the recovered light 122 can be collected by a collimating lens 410 of a fiber collimator 412. Collimating lenses collimate delivered light emerging from a fiber or concentrates recovered light into a fiber. In this illustrative embodiment in FIG. 4, the collimating lens 410 concentrates the recovered light 122 into recovery fiber 136. The recovery fiber 136 can be a multimode fiber, and in some embodiments, the recovery fiber 136 is a free-space optical path to an analyzer 322, e.g., a spectrometer, instead of or in addition to the recovery fiber 136.

Another endpoint of the segmented optical axis 105' is the fiber collimeter 414, which projects the delivered light 123 from a light delivery fiber 134. The delivery fiber 134 can be a single-mode or multimode fiber, and in some embodiments, the delivery fiber 134 can be replaced by a free-space optical path from a light source 323 instead of a fiber. The delivered light 123 from the collimator 414 can be projected through a collimator lens 416 and then to a beamsplitter 418, which redirects the delivered light 123 to the optical beam channel 105. The beamsplitter 418 can be a moveable mirror in some embodiments. Alternatively, the beamsplitter 132 can be implemented as a partially reflecting mirror, a dichroic mirror, or pellicle reflector.

FIG. 6 is a schematic diagram of an optical probe system in accordance with another illustrative embodiment. The optical probe system 600 in FIG. 6 is similar to the optical probe system 200 in FIG. 2 but differs primarily in that the optical probe shaft 202 is housed, at least partially, within a stationary outer tube 602 that extends into a vacuum chamber interior 518 of a vacuum chamber 118. Thus, the external surface of the stationary outer tube 602 is exposed to vacuum pressures and the internal surface of the stationary outer tube 602 (and any components housed therein) is exposed to atmospheric pressures.

The stationary outer tube 602 can be sealed to the microscope wall 108, e.g., via microscope flange (not shown), with a rigid, high-vacuum seal 208 positioned between an outer tube flange 604 and the microscope wall 108. The seal 208 can be an ultra-high vacuum seal, such as ConFlat, which is formed from deformable metal. The stationary outer tube 602 can be sealed at its distal end by a window 220 secured by a window flange 220. In a non-limiting embodiment, the window 220 can be coupled to the window flange 221 by a high temperature adhesive, and the window flange 220 can be affixed to the stationary outer tube 220 by vacuum laser welding.

The optical probe shaft 202, which houses the optical beam channel 105, can be translated inside of the stationary outer tube 602 by the nanomanipulator 212, as in the embodiment of the optical probe system 200 discussed in FIG. 2.

Figure 7:
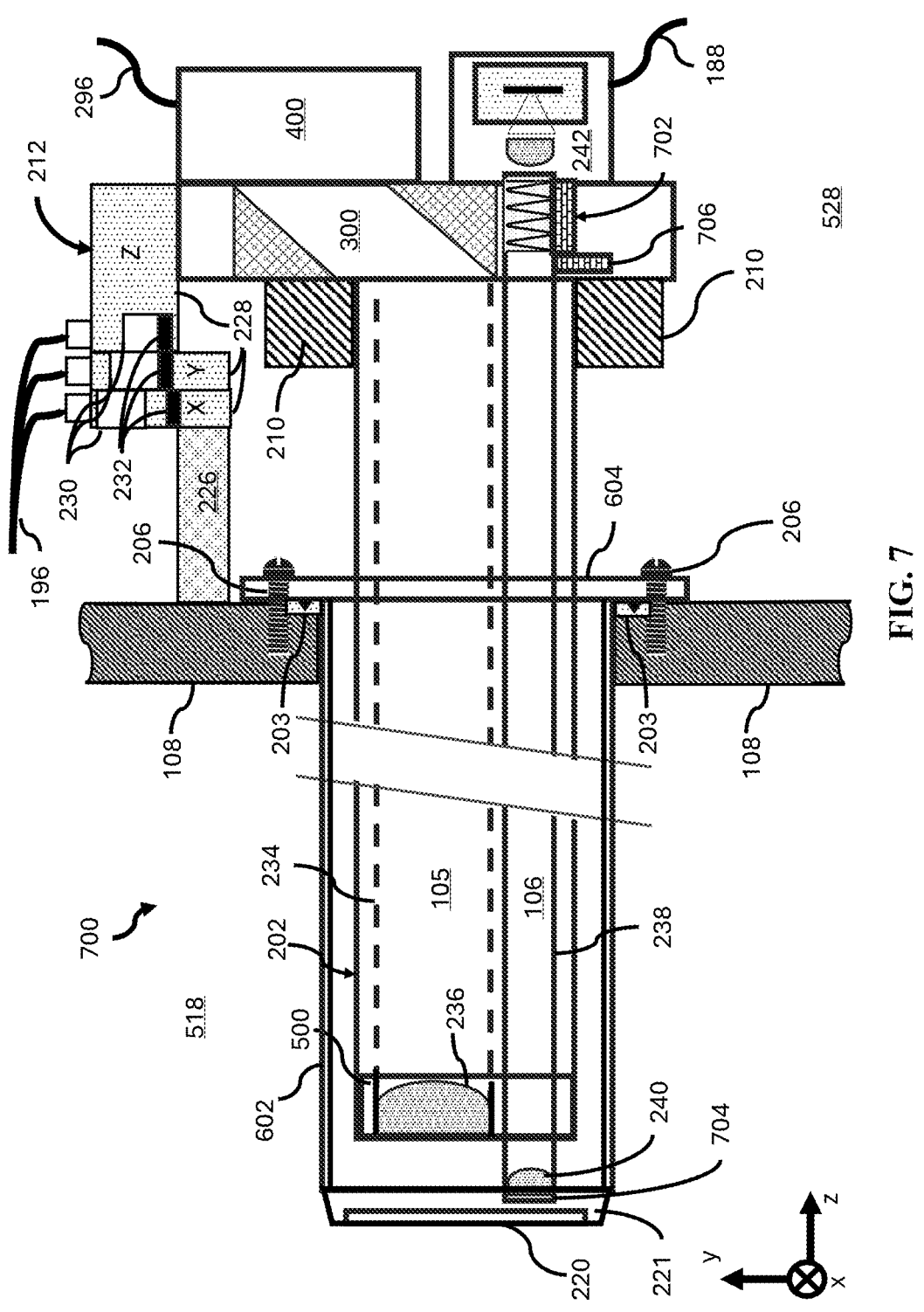
FIG. 7 is a schematic diagram of an optical probe system in accordance with another illustrative embodiment.

In this example, illumination of the sample 545 is accomplished using an optional illumination source 606 disposed at the tip of the borescope tube 238. As an example, the illumination source 606 can be a fiber ring illumination system surrounding the tip of the borescope tube 238. The illumination source 606 can also be LEDs, or optical fiber ends directed out of the FIG. 7 is a schematic diagram of an optical probe system in accordance with another illustrative embodiment. The optical probe system 300 of FIG. 7 is similar to the optical probe system 600 in FIG. 6, except that the optical probe system 300 includes a spring assembly 702 that biases the borescope tube 238 towards a distal end of the stationary outer tube 602 and the borescope tube 238 is slidably engaged with the spacer 500. Thus, the borescope tube 238 containing the borescope channel 106 is spring-loaded so that translation of the borescope tube 238 in the positive or negative Z direction, i.e., in a direction parallel to the axis of the stationary optics tube 202, will allow the tip of the borescope tube 238 to remain in close proximity to the vacuum window 220 to prevent unwanted optical reflections from the illumination source, e.g., a ring illumination 704 surrounding the tip of the borescope tube 238, which can be optically coupled to illumination source 706. The borescope tube 238 is constrained to move in the X and Y directions (where the X and Y directions are orthogonal to each other and perpendicular to the Z axis) by the spacer 500, which can be rigidly secured to the optical beam tube 234.

Figure 8:
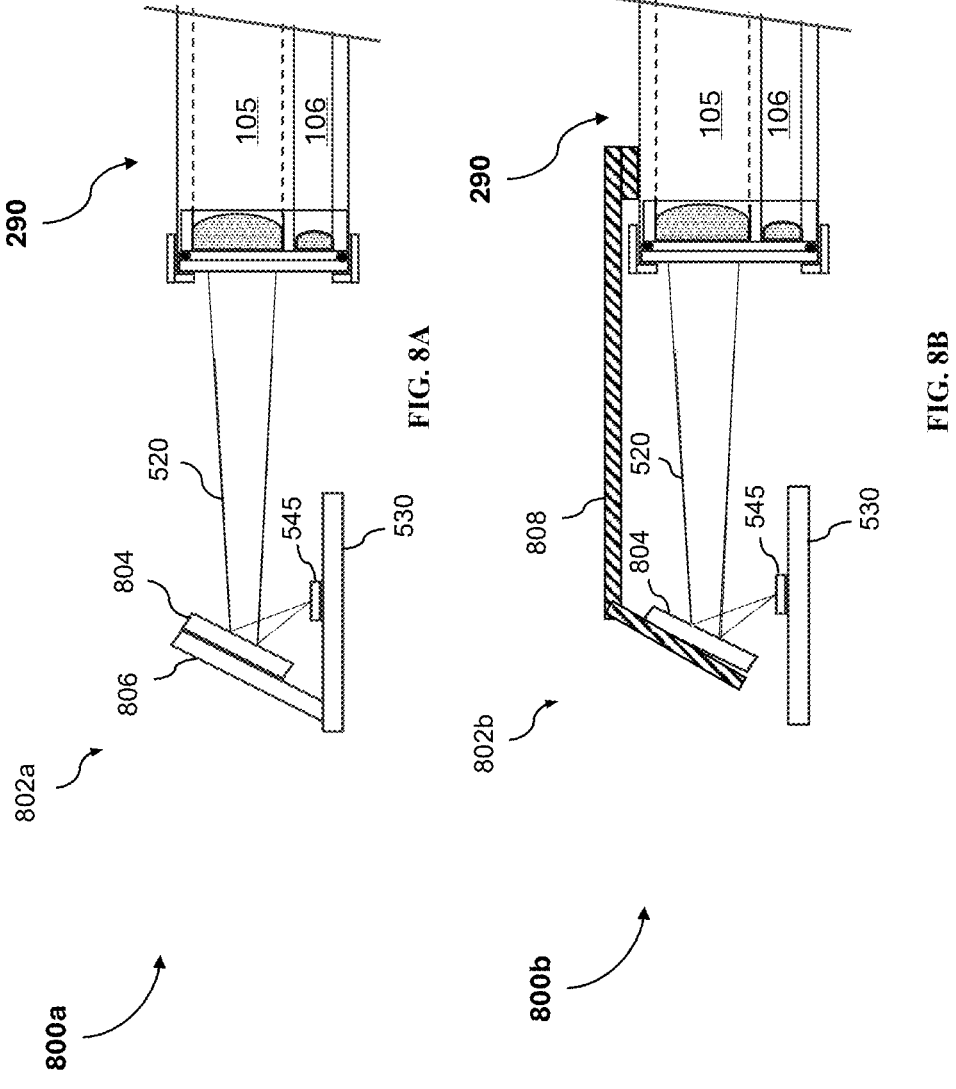
FIGS. 8A and 8B are schematic diagrams of a mirror assembly in accordance with an illustrative embodiment.

FIGS. 8A and 8B are schematic diagrams of a mirror assembly in accordance with an illustrative embodiment. The optical probe system 800a of FIG. 8A includes a mirror assembly 802a that can redirect an optical beam 520 transmitted through the optical beam channel 105 onto a sample 545 supported by sample holder 530. In particular, the mirror assembly 802a includes a turning mirror 804 mounted onto a mirror support 806 affixed to the sample holder 530, but in another embodiment, the mirror support 806 can be affixed to a microscope stage 540. In yet another embodiment, as shown in FIG. 8B, the optical probe system 800b includes a mirror assembly 802b that includes a mirror support 808 attached to the outer surface of the optical probe shaft 202. The turning mirror 804 is shown as a flat mirror, but in another embodiment, the turning mirror can be a non-imaging optic, such as a conic section, e.g., a section of a paraboloid. The optic beam 520 can contain recovered light 122, delivered light 123, or both.

The optical probe systems disclosed herein, e.g., optical probe systems 200, 600, and 700, provide a user with two simultaneous images for rapid alignment of an optical probe such that alignment now takes minutes instead of hours. The first image is a wider field image of the entire sample chamber obtained via the borescope channel 106, which shows the location of a laser spot carried through the optical beam channel 105, even when the laser spot is not yet aligned on the sample. The second image is a high-magnification image of the laser spot on the sample surface. These optical probe systems facilitate initial alignment as well as subsequent alignment when the sample has been moved or a new sample is loaded.

Although the various embodiments of the optical probe systems described in this disclosure include an optical beam channel 105 and a borescope channel 106, the novel aspects of this disclosure can be applied to an optical probe system that replaces the borescope channel 106 with any optical channel that is similarly mounted and aligned so that a user can simultaneously address a sample mounted within a vacuum chamber of a charged particle beam microscope 100 after the two optical channels have been properly aligned. Thus, as used herein, the term "address" as it relates samples mounted within the vacuum chamber of the charged particle beam microscope can generally include operations such as imaging, processing, analyzing, illuminating, exciting, detecting, etc. Additionally, while the various embodiments of the optical probe system described in this disclosure include only two optical channels, a skilled artisan would recognize that the novel aspects of the present disclosure could result in the creation of an optical probe system including three or more optical channels. The plurality of optical channels can be formed from an optical channel having a segmented optical axis and two or more optical channels having unsegmented optical axes, or two or more optical channels that each have a segmented optical axis and one optical channel with an unsegmented optical axis. In yet another embodiment, the plurality of optical channels can be formed from two or more optical channels that each have a segmented optical axis and two or more optical channels that each have an unsegmented optical axis.

Methods

Figure 9:
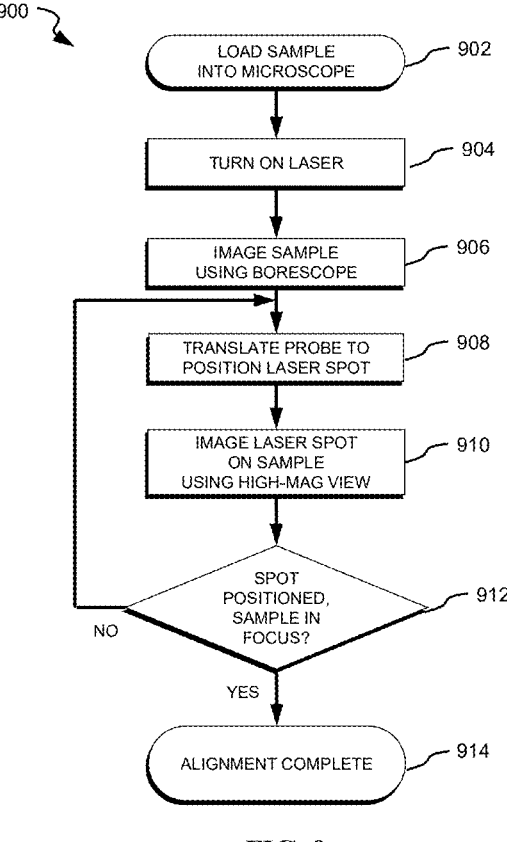
FIG. 9 is a flowchart of an alignment process for an optical probe in a charged particle beam microscope in accordance with an illustrative embodiment.

An exemplary alignment procedure is described in FIG. 9 and generally uses the large field of view image from the borescope channel 106 to rapidly set the lateral positioning of the optical probe 290, e.g., X and Y position, using the nanomanipulator 212 so that a laser spot can be projected onto the sample 545. Then, using the nanomanipulator again, the Z axis position of the optical probe 290 is adjusted to set the optical focus. Once the laser spot has been positioned onto the sample 545, the exact alignment between the laser spot and the charged particle beam 510 (the electron beam in the case of the TEM) can be obtained by using the power of the laser beam to affect the surface of the sample 545 in a way visible in the TEM image. For example, if the sample is a supported holey carbon TEM grid, the laser can be used to easily burn holes in this material which can be seen in the TEM image.

Alternatively, it is useful to use cathodoluminescent (CL) phosphors (such as P47) applied to the sample 545, e.g., the 3 mm TEM grid in the case of the TEM. In this way, both the CL image of the electron beam spot and the visible laser spot, can be seen simultaneously in the large field of view image provided by the borescope channel 106. Overlapping these two spots using the nanomanipulator 212 to position the optical probe shaft 202 provides X and Y alignment. Depending on the wavelength of the laser, the laser spot and the CL glow from electron beam are typically different colors. If the laser wavelength is not visible, e.g., IR, the phosphor output wavelength can be shifted to a visible wavelength with a custom phosphor.

The alignment process according to the method described above can be easily automated using the programmable nanomanipulator 212, for both embodiments described. Using standard image recognition techniques, the optical probe shaft 202 can be translated to place the laser spot on the electron beam impact point on the sample 545, e.g., in the case of a TEM or SEM, and then the focus can be automatically adjusted to bring the high-magnification image and the laser spot into focus on the sample 545. Flowcharts of exemplary methods are described in more detail in the figures that follow.

FIG. 9 is a flowchart of an alignment process for an optical probe in a charged particle beam microscope in accordance with an illustrative embodiment. The process uses a combination of a low-magnification, wide-angle view (via the borescope channel) and high-magnification imaging (via the optical beam channel) for localized view. The steps of flowchart 900 can be carried out by a user operating an optical probe system, such as optical probe system 200 in FIG. 2.

Flowchart 900 begins at step 902 by loading a sample into a microscope. This step can include additional steps such as pump-down of vacuum and preparation for charged particle beam imaging.

In step 904, the laser is turned ON. The laser is preferably operated at low-power continuous mode at a wavelength visible using a borescope.

In step 906, the sample is imaged using a low-magnification, wide area view, e.g. with the borescope channel, which facilitates discovery of the laser spot.

In step 908, the probe is translated to position the laser spot. The probe can be translated in three dimensions, e.g., X and Y (lateral) and Z (focus).

In step 912, the laser spot on the sample is imaged using high-magnification view, e.g., with the optical beam channel.

In step 914, a decision is made as to whether the spot position and focus of the laser on the sample is acceptable. If the spot position and focus of the laser is not acceptable, then flowchart 900 returns to step 908 and the probe is translated to reposition the laser spot. If the spot position and focus of the laser are acceptable, then flowchart 900 proceeds from step 912 to step 914, where the alignment process is completed and the process terminates. Upon completion of step 914, the optical probe system is ready for use with optimal positioning in a charged particle beam microscope.

Figure 10:
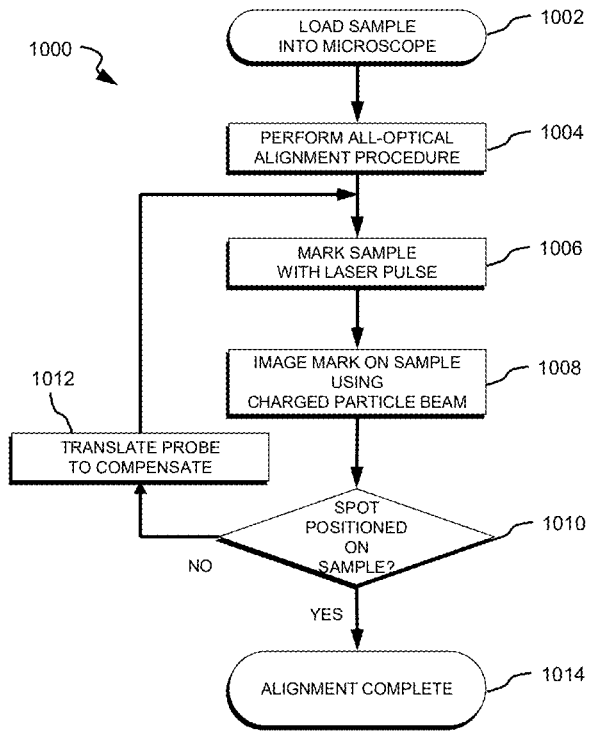
FIG. 10 is a flowchart of an alignment process using laser marking of a sample in accordance with an illustrative embodiment.

FIG. 10 is a flowchart of an alignment process using laser marking of a sample in accordance with an illustrative embodiment. The process uses charged particle beam imaging of a laser mark for fine alignment. The steps of flowchart 1000 can be implemented by a user operating a charged particle beam microscope outfitted with an optical probe system, such as charged particle beam microscope 100 in FIG. 1.

Flowchart 1000 begins at step 1002 by loading a sample into a microscope. This step can include additional steps, such as pump-down of vacuum and preparation for charged particle beam imaging.

In step 1004, an all-optical alignment procedure is carried out. The all-optical alignment procedure can include steps 904-912 from flowchart 900.

In step 1006, the sample is marked with a laser pulse. Step 1006 can include additional steps of modifying power of the laser pulse and the pulse duration to center a mark on the laser spot.

In step 1008, a decision is made as to whether the position of the marked spot is on the sample. The decision can be made with reference to the image provided by the charged particle beam image. If the position of the marked spot is not on the sample, then flowchart 1000 proceeds to step 1012 where the optical probe is translated to move the laser spot onto the marked spot. The optical probe can be translated by using a nanomanipulator that can move the optical probe in the X, Y, and Z directions. The flowchart 1000 can then return to step 1006.

Returning to step 1008, if the decision is made that the position of the marked spot is on the sample, then flowchart 1000 is completed at step 1014.

The laser marking described herein can refer to a permanent mark imparted onto the sample, e.g., by using the laser to make a permanent change on the sample that can be imaged using the charged particle beam after the sample has been irradiated by the laser and after the laser pulse has ended. However, laser marking can also refer to a temporary mark imparted to the sample, such as by causing an enhanced or reduced secondary electron emission, which can affect the charged particle beam imaging contrast during irradiation by the laser.

Figure 11:
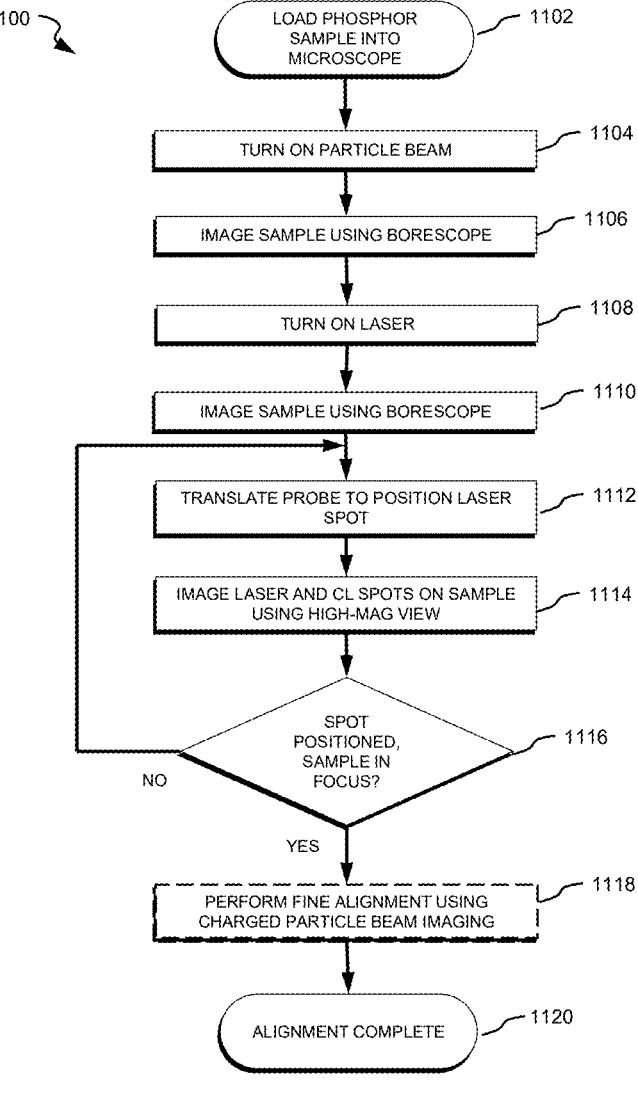
FIG. 11 is a flowchart of an alignment process using a phosphor sample in accordance with an illustrative embodiment.

FIG. 11 is a flowchart of an alignment process using a phosphor sample in accordance with an illustrative embodiment. The steps of flowchart 1100 can be implemented by a user operating a charged particle beam microscope outfitted with an optical probe system, such as charged particle beam microscope 100 in FIG. 1.

Flowchart 1100 begins at step 1102 by loading a phosphor sample into a microscope. This step can include additional steps such as pump-down of vacuum and preparation for charged particle beam imaging.

In step 1104, a charged particle beam is turned on. The charged particle beam causes the phosphor sample to luminesce.

In step 1106, the sample is imaged using a low-magnification, wide area view, e.g. with the borescope channel, to see the position of the cathodoluminescent spot on the phosphor sample.

In step 1108, the laser is turned ON. The laser is preferably operated at low-power continuous mode at a wavelength visible using a borescope.

In step 1110, the sample is again imaged using a low-magnification, wide area view, e.g. with the borescope channel, to see the position of the laser spot on the phosphor sample.

In step 1112, the optics probe is translated to position the laser spot on the cathodoluminescent spot.

In step 1114, the laser spot and the cathodoluminescent spot are imaged using the high-magnification view so that a determination can be made as to whether the laser spot position and focus are acceptable relative to the position of the cathodoluminescent spot. If the laser spot position is not acceptable, then the flowchart 1100 returns to step 1112. However, if the laser spot position is acceptable, then the flowchart 1100 can proceed from step 1116 to an optional step 1118 where the fine alignment steps are performed using the charged particle beam imaging. Step 1118 can include the steps 1006-1010 from flowchart 1000 in FIG. 10. The flowchart 1100 terminates thereafter at step 1120.

Although embodiments of the invention have been described with reference to several elements, any element described in the embodiments described herein are exemplary and can be omitted, substituted, added, combined, or rearranged as applicable to form new embodiments. A skilled person, upon reading the present specification, would recognize that such additional embodiments are effectively disclosed herein. For example, where this disclosure describes characteristics, structure, size, shape, arrangement, or composition for an element or process for making or using an element or combination of elements, the characteristics, structure, size, shape, arrangement, or composition can also be incorporated into any other element or combination of elements, or process for making or using an element or combination of elements described herein to provide additional embodiments.

Additionally, where an embodiment is described herein as comprising some element or group of elements, additional embodiments can consist essentially of or consist of the element or group of elements. Also, although the open-ended term "comprises" is generally used herein, additional embodiments can be formed by substituting the terms "consisting essentially of" or "consisting of."

While this invention has been particularly shown and described with reference to preferred embodiments, it will be understood by those skilled in the art that various changes in form and detail may be made therein without departing from the spirit and scope of the invention. The inventors expect skilled artisans to employ such variations as appropriate, and the inventors intend the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

15

16

We claim:

1. An optical probe system comprising:

an optical probe configured to be mounted to a charged particle beam microscope to permit an optical probe shaft of the optical probe to extend at least partially into a vacuum chamber of the charged particle beam microscope;

a first optical channel extending through the optical probe shaft, wherein the first optical channel accommodates a portion of a segmented optical axis extending between a distal end of the probe and an optical chassis providing a high magnification view of a sample; and a second optical channel extending through the optical probe shaft, wherein the second optical channel accommodates an unsegmented optical axis extending between the distal end of the probe and an eyepiece or camera that provides a low magnification view of the sample, and wherein:

the segmented optical axis includes at least a first segment that is substantially parallel to the unsegmented optical axis and at least a second segment that is not substantially parallel to the unsegmented optical axis, the first segment of the segmented optical axis and the unsegmented optical axis are positioned within the optical probe shaft to permit the first optical channel and the second optical channel to simultaneously address a sample mounted within the vacuum chamber, the first optical channel is configured to transmit and receive light, and the second optical channel is configured to transmit and receive light, wherein the first optical channel and second optical channel are separate optical channels.

2. The optical probe system of claim 1, further comprising a periscope optically coupled to the first optical channel, wherein:

the segmented optical axis includes a third segment that is joined to the first segment by the second segment, the periscope is configured to displace the third segment from the first segment, and the second segment is housed within the periscope.

3. The optical probe system of claim 1, wherein the second optical channel is defined by a borescope tube.

4. The optical probe system of claim 3, wherein the first optical channel is defined by an optical beam tube that is arranged substantially parallel to the borescope tube.

5. The optical probe system of claim 4, further comprising a spacer engaged with the borescope tube and the optical beam tube to maintain the substantially parallel arrangement.

6. The optical probe system of claim 5, wherein the spacer is fixedly engaged with the optical beam tube and slidably engaged with the borescope tube.

7. The optical probe system of claim 6, further comprising a spring assembly that biases the borescope tube towards a distal end of the optical probe shaft.

8. The optical probe system of claim 1, further comprising a nanomanipulator coupled to the optical probe, wherein the nanomanipulator is configured to translate the optical probe shaft in three dimensions within the vacuum chamber.

9. The optical probe system of claim 1, further comprising a vacuum bellows connected between an exterior wall of the charged particle beam microscope and a mount of the optical probe, wherein:

the optical probe shaft extends through the vacuum bellows, and the internal surface of the vacuum bellows is exposed to a vacuum from the vacuum chamber.

10. The optical probe system of claim 1, wherein the segmented optical axis includes a third segment that is joined to the first segment by the second segment, wherein the optical probe system further comprises an optics chassis that houses at least a portion of the third segment, and wherein:

the optics chassis includes a light transmitter configured to transmit light along the segmented optical axis to the vacuum chamber, and the optics chassis includes a light receiver configured to receive light transmitted along the segmented optical axis from the vacuum chamber.

11. The optical probe system of claim 1, further comprising a stationary optics tube housing at least a portion of the optical probe shaft, wherein:

the stationary optics tube extends into the vacuum chamber, and the stationary optics tube insulates the optical probe shaft from a vacuum maintained within the vacuum chamber.

12. The optical probe system of claim 1, wherein the second optical channel provides a lower magnification field of view relative to a higher magnification field of view provided by the first optical channel.

13. A microscope system comprising:

a charged particle beam microscope that includes a vacuum chamber; and an optical probe system comprising:

an optical probe configured to be mounted to the charged particle beam microscope to permit an optical probe shaft of the optical probe to extend at least partially into the vacuum chamber of the charged particle beam microscope;

a first optical channel extending through the optical probe shaft, wherein the first optical channel accommodates a portion of a segmented optical axis extending between a distal end of the probe and an optical chassis providing a high magnification view of a sample; and a second optical channel extending through the optical probe shaft, wherein the second optical channel accommodates an unsegmented optical axis extending between the distal end of the probe and an eyepiece or camera that provides a low magnification view of the sample, and wherein:

the segmented optical axis includes at least a first segment that substantially parallel to the unsegmented optical axis and at least a second segment that is not substantially parallel to the unsegmented optical axis, the first segment of the segmented optical axis and the unsegmented optical axis are positioned within the optical probe shaft to permit the first optical channel and the second optical channel to simultaneously address a sample mounted within the vacuum chamber, the first optical channel is configured to transmit and receive light, and the second optical channel is configured to transmit and receive light, wherein the first optical channel and second optical channel are separate optical channels.

14. The microscope system of claim 13, further comprising a periscope optically coupled to the first optical channel, wherein:

the segmented optical axis includes a third segment that is joined to the first segment by the second segment, the periscope is configured to displace the third segment from the first segment, and the second segment is housed within the periscope.

15. The microscope system of claim 13, wherein the second optical channel is defined by a borescope tube.

16. The microscope system of claim 15, wherein the first optical channel is defined by an optical beam tube that is arranged substantially parallel to the borescope tube.

17. The microscope system of claim 16, further comprising a spacer engaged with the borescope tube and the optical beam tube to maintain the substantially parallel arrangement.

18. The microscope system of claim 17, wherein the spacer is fixedly engaged with the optical beam tube and slidably engaged with the borescope tube.

19. The microscope system of claim 18, further comprising a spring assembly that biases the borescope tube towards a distal end of the optical probe shaft.

20. The microscope system of claim 13, further comprising a nanomanipulator coupled to the optical probe, wherein the nanomanipulator is configured to translate the optical probe shaft in three dimensions within the vacuum chamber.

21. The microscope system of claim 13, further comprising a vacuum bellows connected between an exterior wall of the charged particle beam microscope and a mount of the optical probe, wherein:

the optical probe shaft extends through the vacuum bellows, and the internal surface of the vacuum bellows is exposed to a vacuum from the vacuum chamber.

22. The microscope system of claim 13, wherein the segmented optical axis includes a third segment that is joined to the first segment by the second segment, wherein the optical probe system further comprises an optics chassis that houses at least a portion of the third segment, and wherein:

the optics chassis includes a light transmitter configured to transmit light along the segmented optical axis to the vacuum chamber, and the optics chassis includes a light receiver configured to receive light transmitted along the segmented optical axis from the vacuum chamber.

23. The microscope system of claim 13, further comprising a stationary optics tube housing at least a portion of the optical probe shaft, wherein:

the stationary optics tube extends into the vacuum chamber, and the stationary optics tube insulates the optical probe shaft from a vacuum maintained within the vacuum chamber.

24. The microscope system of claim 13, wherein the second optical channel provides a lower magnification field of view relative to a higher magnification field of view provided by the first optical channel.

25. The optical probe system of claim 1, wherein the optical probe shaft extends at least partially outside of the vacuum chamber.

* * * * *